United States Patent
Wu et al.

(10) Patent No.: US 7,425,913 B2
(45) Date of Patent: Sep. 16, 2008

(54) BIT-ADJACENCY CAPACITOR-SWITCHED DAC, METHOD, DRIVER AND DISPLAY DEVICE

(75) Inventors: Zhong Yuan Wu, Yongin-si (KR); Yoon-Kyung Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/644,991

(22) Filed: Dec. 26, 2006

(65) Prior Publication Data
US 2007/0216563 A1 Sep. 20, 2007

(30) Foreign Application Priority Data
Jan. 2, 2006 (KR) .................. 10-2006-0000272

(51) Int. Cl.
*H03M 1/66* (2006.01)

(52) U.S. Cl. .................. 341/150; 341/144; 345/89; 345/98; 345/99; 345/100

(58) Field of Classification Search .................. 341/150
See application file for complete search history.

(56) References Cited

U.S. PATENT DOCUMENTS

| | | | |
|---|---|---|---|
| 5,696,509 A | 12/1997 | Maejima | |
| 5,923,275 A | 7/1999 | Kalb | |
| 6,225,931 B1 * | 5/2001 | Rao et al. | 341/144 |
| 6,498,596 B1 * | 12/2002 | Nakamura et al. | 345/98 |
| 6,778,121 B2 * | 8/2004 | Manganaro | 341/150 |
| 6,838,930 B2 * | 1/2005 | Huynh | 330/9 |
| 6,924,760 B1 | 8/2005 | McLeod et al. | |
| 7,102,557 B1 * | 9/2006 | Frith | 341/150 |
| 2002/0105361 A1 | 8/2002 | Brunolli | |
| 2002/0140950 A1 | 10/2002 | Yasutoshi et al. | |
| 2007/0194964 A1 * | 8/2007 | Chang et al. | 341/144 |

FOREIGN PATENT DOCUMENTS

JP          2001-94426          4/2001

OTHER PUBLICATIONS

L. Weyten et al., "Two-Capacitor DAC With Compensative Switching" Electronic Letters, vol. 31, No. 17, Aug. 17, 1995, pp. 1435-1437.
Liang Dai et al., "CMOS Switched-Op-Amp-Based Sample-and-Hold Circuit" IEE J. of Solid-State Circuits, vol. 35, No. 1, Jan. 2000, pp. 109-113.
R. Suarez et al., "All-MOS Charge Redistribution Analog-to-Digital Conversion Techniques- Part II" IEEE J. of Solid-State Circuits, vol. SC-10, No. 6, Dec. 1975, pp. 379-385.

\* cited by examiner

*Primary Examiner*—Khai M Nguyen
(74) *Attorney, Agent, or Firm*—Harness, Dickey & Pierce, P.L.C.

(57) ABSTRACT

A cyclic digital to analog converter (CDAC) includes: first and second capacitors C1 and C2; an arrangement of switches selectively controllable to connect C1 and C2 in one of at least two charging-and-sharing configurations, the first configuration having the first capacitor C1 as a charging capacitor CCH and the second capacitor C2 as a sharing capacitor CSH, namely CCH=C1 and CSH=C2, and the second configuration having CCH=C2 and CSH=C1; and a controller to toggle the arrangement of switches between the first and second configurations based upon adjacent bits of a given input word.

21 Claims, 9 Drawing Sheets

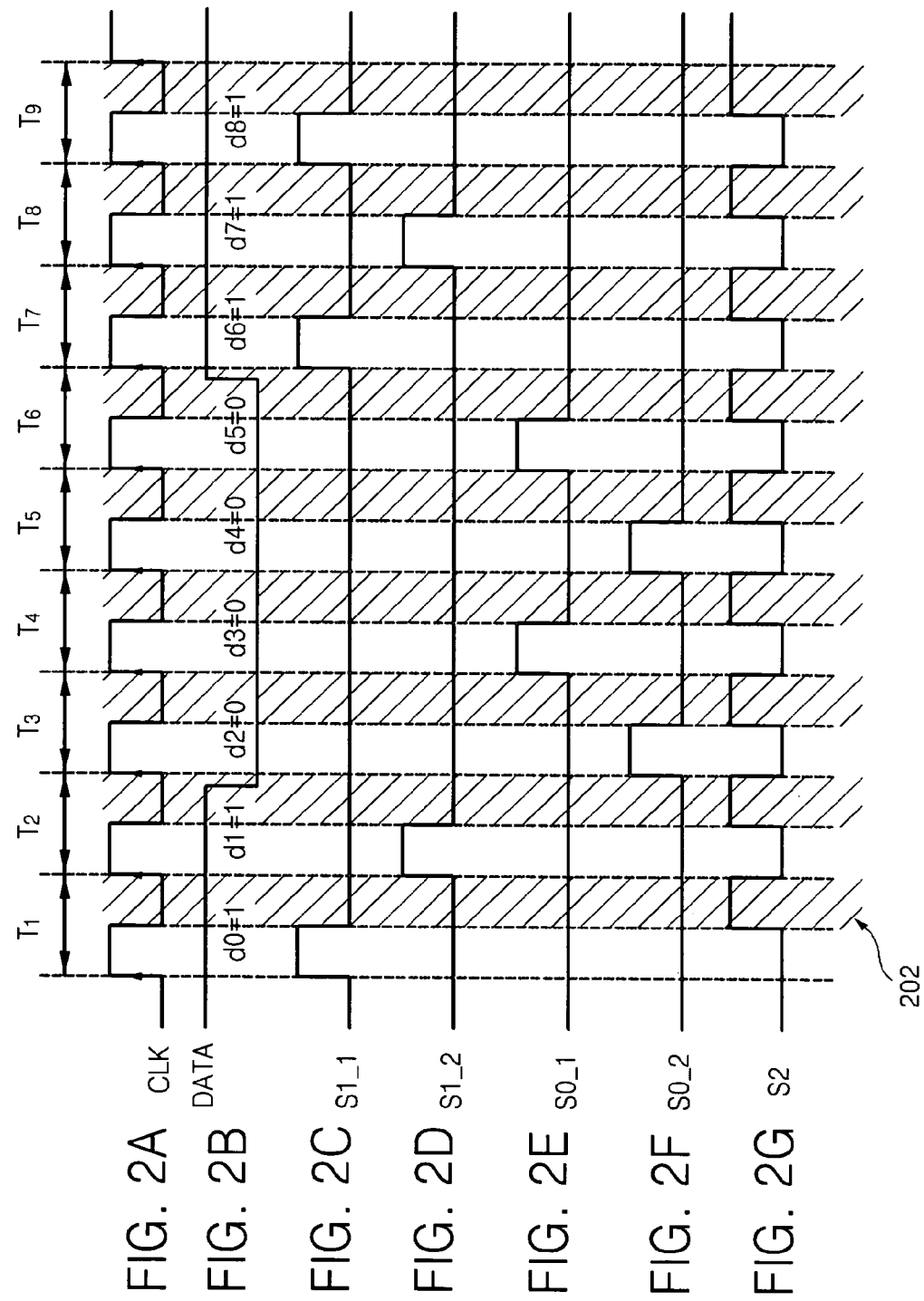

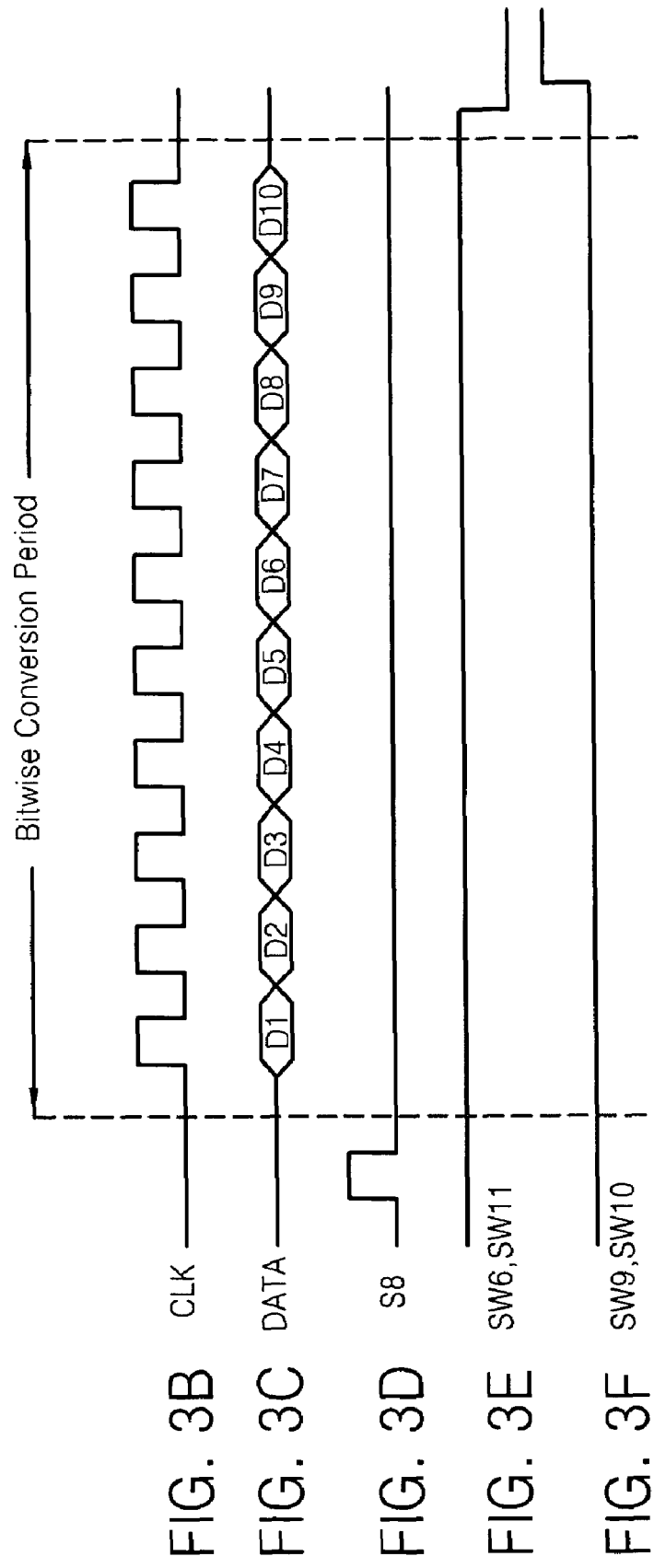

BIT-ADJACENCY CAPACITOR-SWITCHED DAC, METHOD, DRIVER AND DISPLAY DEVICE

PRIORITY STATEMENT

This application claims the priority under 35 U.S.C. §119 upon Korean Patent Application No. P2006-0000272, filed on Jan. 2, 2006, the disclosure of which is incorporated herein in its entirety by reference.

BACKGROUND

Serial charge-redistribution cyclic digital-to-analog converters (CDACs) are generally known in the Background Art. Such a Background Art CDAC 700 is depicted in FIG. 7.

FIG. 7 is a schematic of a serial charge-redistribution cyclic digital-to-analog converter(CDAC) according to the Background Art.

Charge redistribution in CDAC 700 is achieved by selective control of MOS-type switches SB0-SB3 and SBINIT. Operation of CDAC 700 includes the following. Before beginning to convert an N-bit word, a charging capacitor $C_{CH}$ is initialized by discharging it via open switches SB1 and SB3 and a closed switch SB2 while a sharing capacitor $C_{SH}$ is initialized by discharging it via an open switches SB2 and SB3 and a closed switch SBINIT. Then, for each of the N bits in the word, a cycle of a charging mode followed by a sharing mode is iterated.

During the charging mode, the following occurs: charging capacitor $C_{CH}$ and a sharing capacitor $C_{SH}$ are isolated by an open switch SB2; according to the value of $i^{th}$ bit, di, capacitor $C_{CH}$ is charged to either $V_{REF}$ or $V_{SS}$ by a closed switch SB1 and an open switch SB0, or vice-versa, respectively; and a voltage on sharing capacitor $C_{SH}$ is maintained by open switches SB2, SB3 and SBINIT. During the subsequent sharing mode, the following occurs: charge on the charging capacitor $C_{CH}$ is shared with sharing capacitor $C_{SH}$ via open switches SB0 and SB1, a closed switch SB2 and open switches SB3 and SBINIT.

With each iteration, charge is permitted to accumulate on sharing capacitor $C_{SH}$. After the charging/sharing cycle has been iterated for the Nth bit, the accumulated charge is provided to the non-inverting input of operational amplifier (op-amp) 702 via a closed switch SB3 and open switches SB2 and SBINIT.

As is known, distortion is introduced into the conversion by CDAC 700 due at least to two factors: (1) a capacitor mismatch error (e.g., due to manufacturing tolerances) between charging capacitor $C_{CH}$ and sharing capacitor $C_{SH}$; and (2) a charge injection error caused by switch SB3.

Various attempts at reducing such distortions have been attempted. One such solution (not depicted) provides CDAC 700 with additional switches so that a swap can be made between alternative configurations for the charging capacitor $C_{CH}$ and the sharing capacitor $C_{SH}$. More particularly, in a first configuration, a first capacitor C1 is connected as the charging capacitor $C_{CH}$ while a second capacitor C2 is connected as the sharing capacitor $C_{SH}$. In a second configuration, the converse applies, namely the first capacitor C1 is connected as the sharing capacitor $C_{SH}$ and the second capacitor C2 is connected as the charging capacitor $C_{CH}$. Without regard to the data words that are to be converted, an arbitrary choice is made for which the first or second configuration is used to begin the bit-by-bit conversion. The determination of whether to swap configurations for an $i^{th}$ bit is a cumulative calculation. Furthermore, the cumulative swap-decision calculation must be carried out in advance for all N bits because calculation proceeds from the most significant bit (MSB) to the least significant bit (LSB), whereas bit conversion itself typically proceeds from the LSB to the MSB.

SUMMARY

An embodiment of the present invention provides a cyclic digital to analog converter (CDAC). Such a CDAC may include: first and second capacitors C1 and C2; an arrangement of switches selectively controllable to connect C1 and C2 in one of at least two charging-and-sharing configurations, the first configuration having the first capacitor C1 as a charging capacitor CCH and the second capacitor C2 as a sharing capacitor CSH, namely CCH=C1 and CSH=C2, and the second configuration having CCH=C2 and CSH=C1; and a controller to toggle the arrangement of switches between the first and second configurations based upon adjacent bits of a given input word.

An embodiment of the present invention provides a method of using a charging-and-sharing arrangement of first and second capacitors C1 and C2 to facilitate digital to-analog conversion. Such a method may include: examining adjacent bits of a given input word; and selectively connecting the first and second capacitors C1 and C2 in one of two configurations, namely a first configuration in which the first capacitor C1 is a charging capacitor CCH and the second capacitor C2 is a sharing capacitor CSH and a second configuration that is the converse thereof, based upon the examination.

An embodiment of the present invention provides a display device. Such a display may include: a display panel; and gate and source drivers to drive the display panel. Such a source driver includes a plurality of cyclic digital to analog converters (CDACs), and each CDAC may include: a plurality of first and second capacitors C1 and C2, an arrangement of switches selectively controllable to connect C1 and C2 in one of at least two configurations, a first configuration having the first capacitor C1 as a charging capacitor CCH and the second capacitor C2 as a sharing capacitor CSH, namely (CCH=C1, CSH=C2), and a second configuration having CCH=C2 and CSH=C1; and a controller to toggle the arrangement of switches between the first and second configurations based upon adjacent bits of a given input word.

Additional features and advantages of the present invention will be more fully apparent from the following detailed description of example embodiments, the accompanying drawings and the associated claims.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted.

FIGS. 2A-2G are timing waveforms that describe operation (according to an example embodiment of the present invention) of a switching-compensated voltage-to-charge conversion circuit such as depicted in FIG. 1A.

FIGS. 3B-3F are timing waveforms that describe operation (according to an example embodiment of the present invention) of the charge injection protection circuit and the differential input amplifier of FIG. 3A.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 1A:
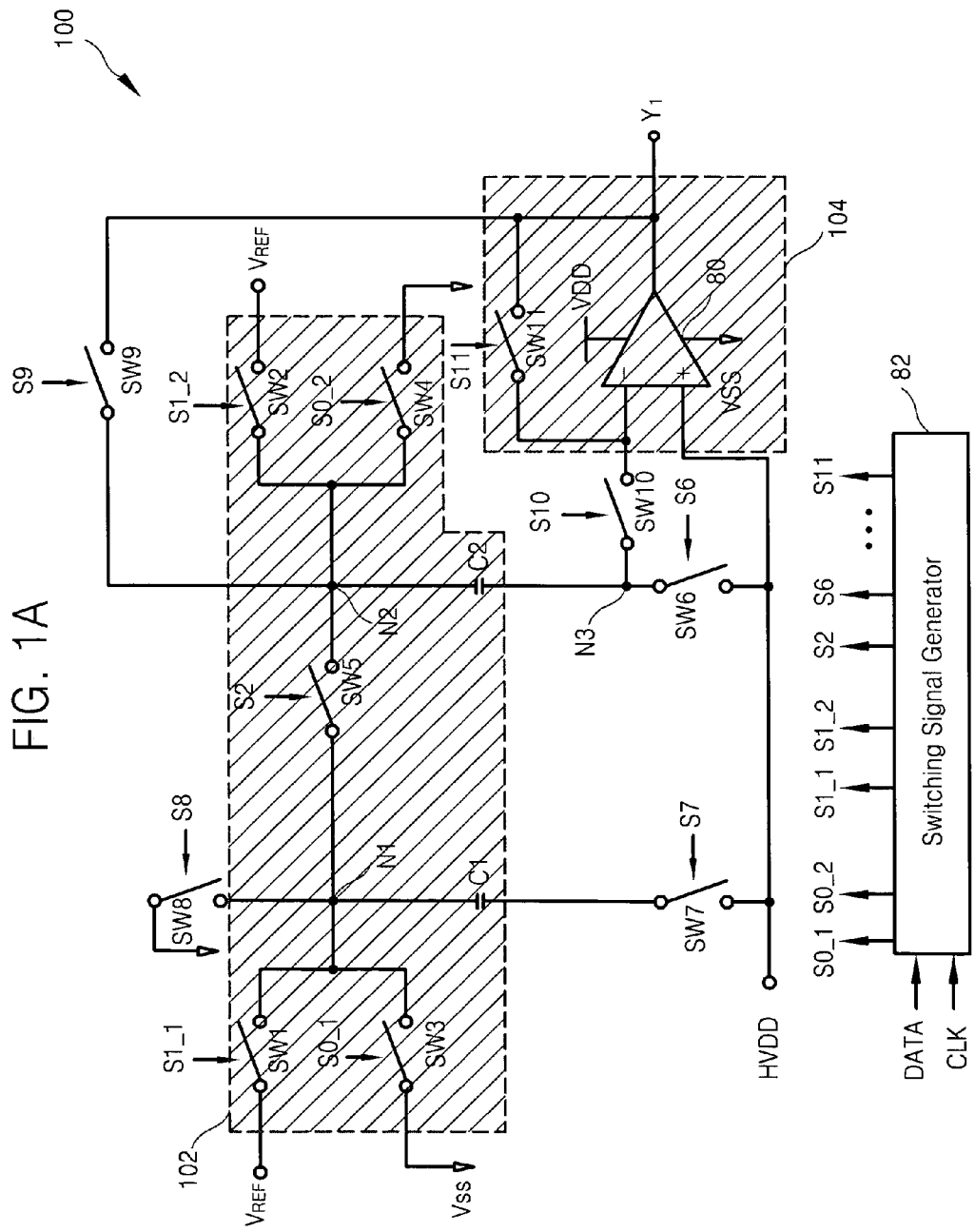
FIG. 1A depicts a schematic of a bit-adjacency capacitor-switched cyclic digital to analog converter (CDAC) according to an example embodiment of the present invention.

FIG. 1A dipicts a schematic of a bit-adjacency capacitor-switched cyclic digital to analog converter(CDAC) according to an example embodiment of the present invention.

In FIG. 1A, the CDAC 100 includes: MOS-type switches SW1-SW11 (of which it so happens that all are logic-one enabled, except for SW5 which is logic-zero enabled—alternative combinations are contemplated); capacitors C1 and C2; an operational amplifier (op-amp) 80 whose non-inverting input is connected to reference voltage $HV_{DD}$ that is about ½ of a system voltage $V_{DD}$, whose positive power supply is connected to $V_{DD}$ and whose negative power supply is connected to $V_{SS}$; and a switching signal generator (SSG) 82. The capacitors should be as close to the same capacitance as permitted by manufacturing tolerances.

The first and second switches SW1 and SW2 are for selectively connecting a reference voltage, $V_{REF}$, to nodes N1 and N2, respectively. The third and fourth switches SW3 and SW4 are for selectively connecting a system-ground voltage, $V_{SS}$, to first and second nodes N1 and N2, respectively. The fifth switch SW5 is for selectively connecting node N1 to node N2. The capacitor C1 has its first terminal connected to node N1. The capacitor C2 has its first terminal connected to node N2. The sixth switch SW6 is for selectively connecting a second terminal of capacitor C2, which represents a third node N3, to the non-inverting input of op-amp 80. The seventh switch SW7 is for selectively connecting a second terminal of capacitor C1 to the non-inverting input of op-amp 80. The eighth switch SW8 is for selectively connecting node N1 to VSS. The ninth switch SW9 is for selectively connecting the output of op-amp 80 to node N2. The tenth switch SW10 is for selectively connecting the inverting input of op-amp 80 to node N3. The eleventh switch SW11 is for selectively connecting the output of op-amp 80 to the inverting input of op-amp 80.

The SSG 82 operates upon the data, namely signal DATA, that is to be converted from digital to analog and upon a clock signal CLK. The signal DATA is organized as a sequence of N-bit words, $D_{N-1}, D_{N-2}, \ldots, D_2, D_1, D_0$. In turn, SSG 82 generates switching signals including SO_1, SO_2, S1_1, S1_2 and S2-S11. More detail about the operation of SSG 82 is provided below. Switches SW1-SW11 are controlled by the signals SO_1, SO_2, S1_1, S1_2 and S2-S11, respectively. More detail about the operation of switches SW1-SW11 is provided below.

In FIG. 1A, a box 102 representing a switching-compensated voltage-to-charge conversion (VCC) circuit 102 (according to an example embodiment of the present invention) is superimposed on CDAC 100; more detail about the operation of VCC circuit 102 is provided below. Also in FIG. 1A, a box 104 representing a unit gain amplifier (according to an example embodiment of the present invention) is superimposed on CDAC 100; more detail about the operation of unit gain amplifier 104 is provided below.

Figure 1B:
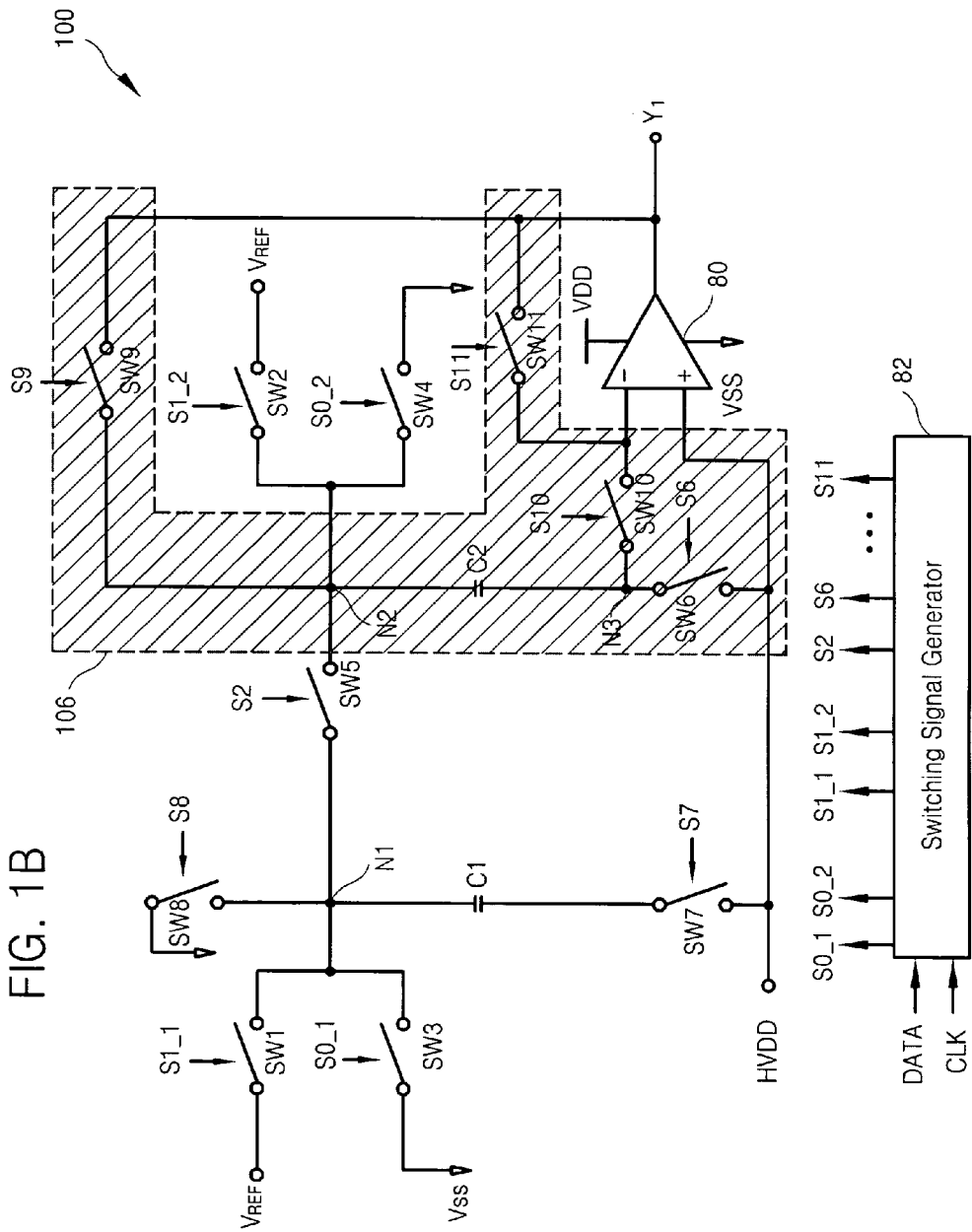
FIG. 1B depicts the bit-adjacency capacitor-switched cyclic digital to analog converter (CDAC) of FIG. 1A on which is superimposed a box representing a charge injection protection circuit according to an example embodiment of the present invention.

FIG. 1B depicts the bit-adjacency capacitor-switched cyclic digital to analog Converter (CDAC) of FIG. 1A on which is superimposed a box presenting a charge injection protection circuit according to an example embodiment of the present invention.

More detail about the operation of charge injection protection circuit 106 is provided below.

Discussion of the operation of CDAC 100 begins by mentioning a couple of figures of merit by which CDACs are typically evaluated, namely the error in Integral Non-Linearity (INL), and the error in Differential Non-Linearity (DNL).

The INL error describes the maximum deviation from an ideal transfer function. The DNL error describes the error in CDAC step size, such that (for any given quantum), the DNL error is the actual step size minus the ideal step size. In other words, the INL is the sum of the DNL errors.

In the work that resulted (at least in part) in one or more embodiments of the present invention, the inventor realized the following. The Background Art CDAC (not depicted) is operated so that the same capacitor, be it capacitor C1 or C2, is used as charging capacitor $C_{CH}$ for the least significant bit (LSB), irrespective of the data words that are to be converted. However, if the designation of capacitor C1 or C2 is not permitted to be arbitrary, but instead is made dependent upon the data to be converted, then the INL error can be reduced. In particular, if a decision rule is used to make the initial designation of capacitor C1 or C2 as charging capacitor $C_{CH}$ for the least significant bit (LSB), then the INL error can be reduced. Such a decision rule is provided by one or more embodiments of the present invention, an example embodiment of the rule being:

Rule (1)

if the LSB is zero (d0=0),
    then C1=$C_{CH}$ and C2=$C_{SH}$;
else if the LSB is one (d0=1),
    then C1=$C_{SH}$ and C2=$C_{CH}$, or vice-versa.

Also, in the work that resulted (at least in part) in one or more embodiments of the present invention, the inventor further realized the following. The Background Art CDAC (not depicted) is operated so that the determination of whether to swap configurations for an $i^{th}$ bit is carried out in advance for all N bits because the cumulative swap-decision calculation not only is cumulative, but is cumulative beginning with the most significant bit (MSB) and proceeding to the least significant bit (LSB). This slows down bit conversion because bit conversion typically proceeds from the LSB to the MSB, hence bit conversion cannot begin until the cumulative swap-decision calculation for the LSB is completed. Also, the cumulative nature of the Background Art swap-decision calculation necessitates the provision of memory, which increases the complexity, footprint, cost, etc., of any CDAC using such an architecture. If, however, the swap-decision calculation can be made less cumulative, then conversion speed can be improved and the CDAC architecture can be made relatively simpler, smaller of footprint, less costly, etc. At least one embodiment of the present invention succeeds in making the swap-decision relatively less cumulative.

An example of such a less-cumulative swap-decision rule, according to an example embodiment of the present invention handles the swap-decisions for bits 1 through N-1 of the N-bit word, i.e., for di, where i=1~N-1, as follows:

Rule (2)

if d(i+1)=d(i),
    then swap the capacitors;
else if d(i+1)≠d(i),
    then do not swap the capacitors.

A benefit of such a bit-adjacency swap-decision rule is not only that capacitor mismatch error can be reduced (essentially by cancelling the residual voltage that accumulates as bits 0, 1, . . . , N-1 are converted), but such a reduction can be achieved using a CDAC architecture that requires relatively less memory and so is relatively simpler, smaller of footprint, less costly, etc. An example of swapping the capacitors is that if C1=$C_{CH}$ and C2=$C_{SH}$, then swap so that C1=$C_{SH}$ and C2=$C_{CH}$, or vice-versa.

FIGS. 2A-2G are timing waveforms that describe operation (according to an example embodiment of the present invention) of a switching-compensated voltage-to-charge conversion circuit such as depicted in FIG. 1A.

More particularly, the waveforms of FIGS. 2A-2G describe the operation of VCC circuit 102 for the specific hypothetical example of converting the 9-bit sequence 110000111. In FIGS. 2A-2G it is assumed that Rule (1) has been applied, such that for d0=1, capacitor C1=$C_{CH}$ and capacitor C2=$C_{SH}$. Further as to FIGS. 2A-2G, it is assumed that capacitors C1 and C2 have been initialized. For example, such initialization during an interval T0 can be achieved by discharging capacitor C1 (again, C1=$C_H$(T0)) via a closed switch SW8 and open switches SW1, SW3 and SW5 while capacitor C2 (again, C2=$C_{SH}$(T0)) is initialized by discharging it via a closed switch SW4 and open switches SW2, SW6, SW9 and SW10. Alternatively, the function of switch SW8 can be achieved by, e.g., controlling switch SW3 in a different manner.

During interval T1 corresponding to conversion of bit d0, capacitor C1=$C_{CH}$(T1) and capacitor C2=$C_{SH}$(T1) are isolated by an open switch SW5. A charging mode is used in the first half of the period of CLK, where interval Ti corresponds to a period of CLK, for i=1~9 in FIGS. 2A-2G. There, capacitor C1=$C_{CH}$(T1) is charged to $V_{REF}$ (because d0=1) due to a positive pulse (i.e., a logical one) on signal S1_1 that causes switch SW1 to close, and a no pulse (i.e., a logical zero) on signal S0_1) that causes switch SW3 to open. Also there, capacitor C2=$C_{SH}$(T1) is discharged to Vss by a logical zero on each of signals S1_2 and S0_2 that cause switches SW2 and SW4 to open, respectively.

During the second half of interval T1 (indicated by shading and item number 202 in FIGS. 2A-2G), a sharing (or discharging) mode is used. There, the charge on capacitor C1=$C_{CH}$(T1) is shared with capacitor C2=$C_{SH}$(T1) due to a logical one on signal S2 that causes switch SW5 to close. At the same time, logical zeros on signals S1_1, S1_2, S0_1 and S0_2 cause switches SW1, SW2, SW3 and SW4 to open, respectively.

At the next interval, T2 corresponding to conversion of bit d1, Rule (2) dictates that the capacitors should be swapped because d1=1, which equals d0, hence capacitor C1=$C_{SH}$(T2) and capacitor C2=$C_{CH}$(T2). During the first half of T2 as the charging mode is being used, capacitor C2=$C_{CH}$(T2) is charged to $V_{REF}$ (because d1=1) due to a logical one on signal S1_2 that causes switch SW2 to close, and a logical zero on signal S0_2 that causes switch SW4 to open. Also there, capacitor C1=$C_{SH}$(T2) is discharged to Vss by logical zeroes on signals S1_1 and S0_1 that cause switches SW1 and SW3 to open, respectively.

During the second half of interval T2, the sharing mode is used. There, the charge on capacitor C2=$C_{CH}$(T2) is shared with capacitor C1=$C_{SH}$(T2) due to a logical one on signal S2 that causes switch SW5 to close. At the same time, logical zeros on signals S1_1, S1_2, S0_1 and S0_2 cause switches SW1, SW2, SW3 and SW4 to open, respectively.

In the next interval, T3 corresponding to conversion of bit d2, Rule (2) dictates that the capacitors should not be swapped because d2=0, whereas d1=1. At interval T4 corresponding to conversion of bit d3, Rule (2) dictates that the capacitors should be swapped because d3=0=d2. Further discussion of the capacitor-swapping decisions and signal variations depicted in FIGS. 2A-2G is omitted for brevity.

Figure 3A:
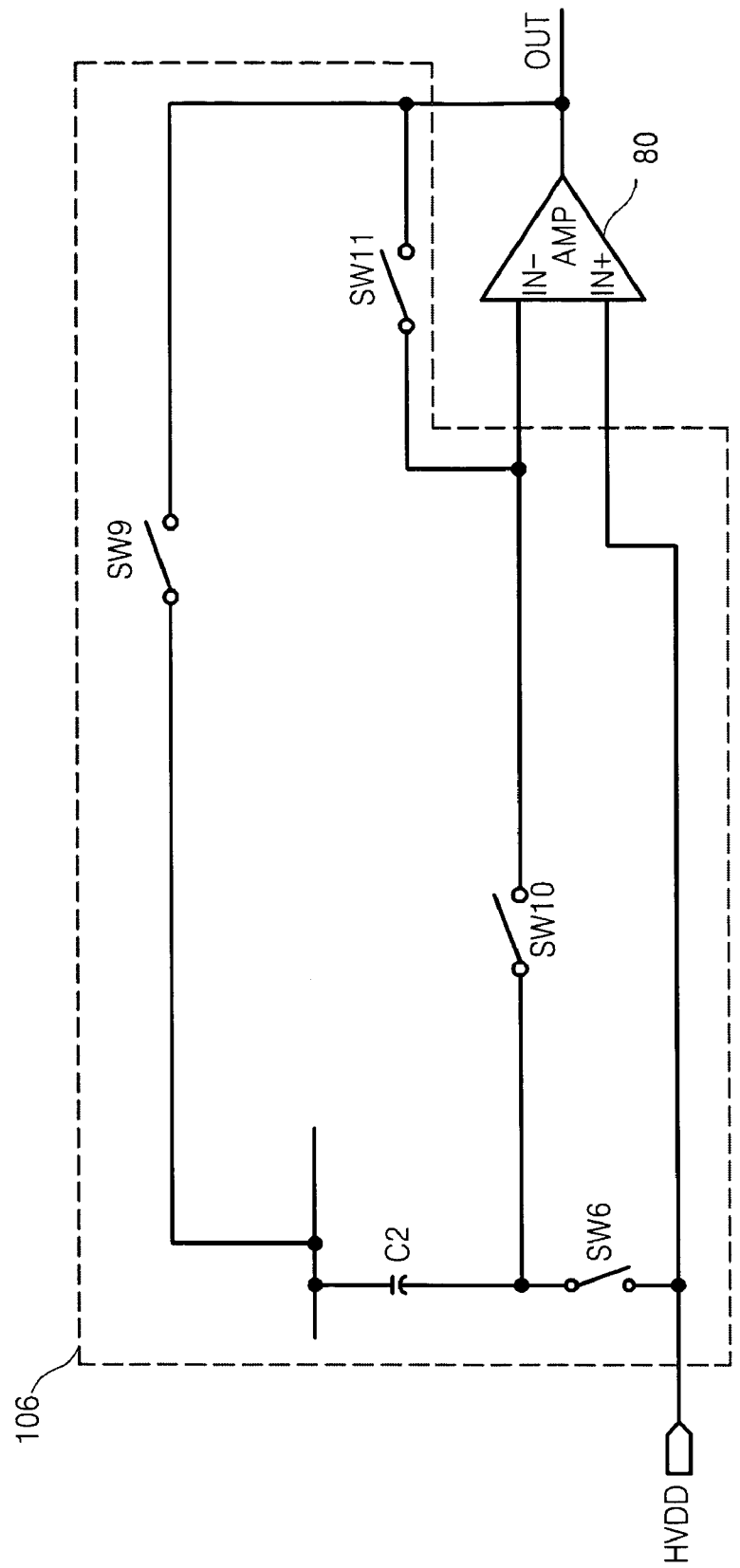
FIG. 3A depicts a simplified schematic of the charge injection protection circuit and the differential input amplifier of FIG. 1B.

FIG. 3A depicts a simplified schematic of the charge injection protection circuit and the differential input amplifier of FIG. 1B.

Charge injection protection circuit 106 of FIG. 3A includes: op-amp 80; capacitor C2; and switches SW6, SW9, SW10 and SW11. For circuit 106, capacitor C2 is used as a holding element in a sample-and-hold arrangement.

FIGS. 3B-3F are timing waveforms that describe operation (according to an example embodiment of the present invention) of the charge injection protection circuit and the differential input amplifier of FIG. 3A.

After the bitwise conversion period of CDAC 100 (see FIGS. 3B-3D), there is a transition to an amplification mode. During the transition, switch SW2 (not shown) and switch SW7 (not shown) and switches SW6 and SW11 (see FIG. 3E) are opened while switches SW9 and SW10 are closed (see FIG. 3F). As a result, capacitor C2 becomes connected as the holding element in the sample-and-hold arrangement.

In more detail as to the transition, switches SW6 and SW11 turn off slightly before switches SW9 and SW10 turn on. When switch SW6 is opened (turned off), it injects a charge into the parasitic capacitor (not depicted) in the non-inverting input of op-amp 80. However, the non-inverting input also remains connected to $HV_{DD}$, hence the charge q1 has a negligible negative effect upon the voltage seen by the non-inverting input. Essentially no charge is injected into the inverting input of op-amp 80 due to switches SW6 and SW11 being opened and switches SW9 and SW10 being closed because of capacitor C2 now being present in the feedback path between the output and the inverting input of op-amp 80. Accordingly, charge injection error is reduced, if not substantially prevented.

Figure 4:
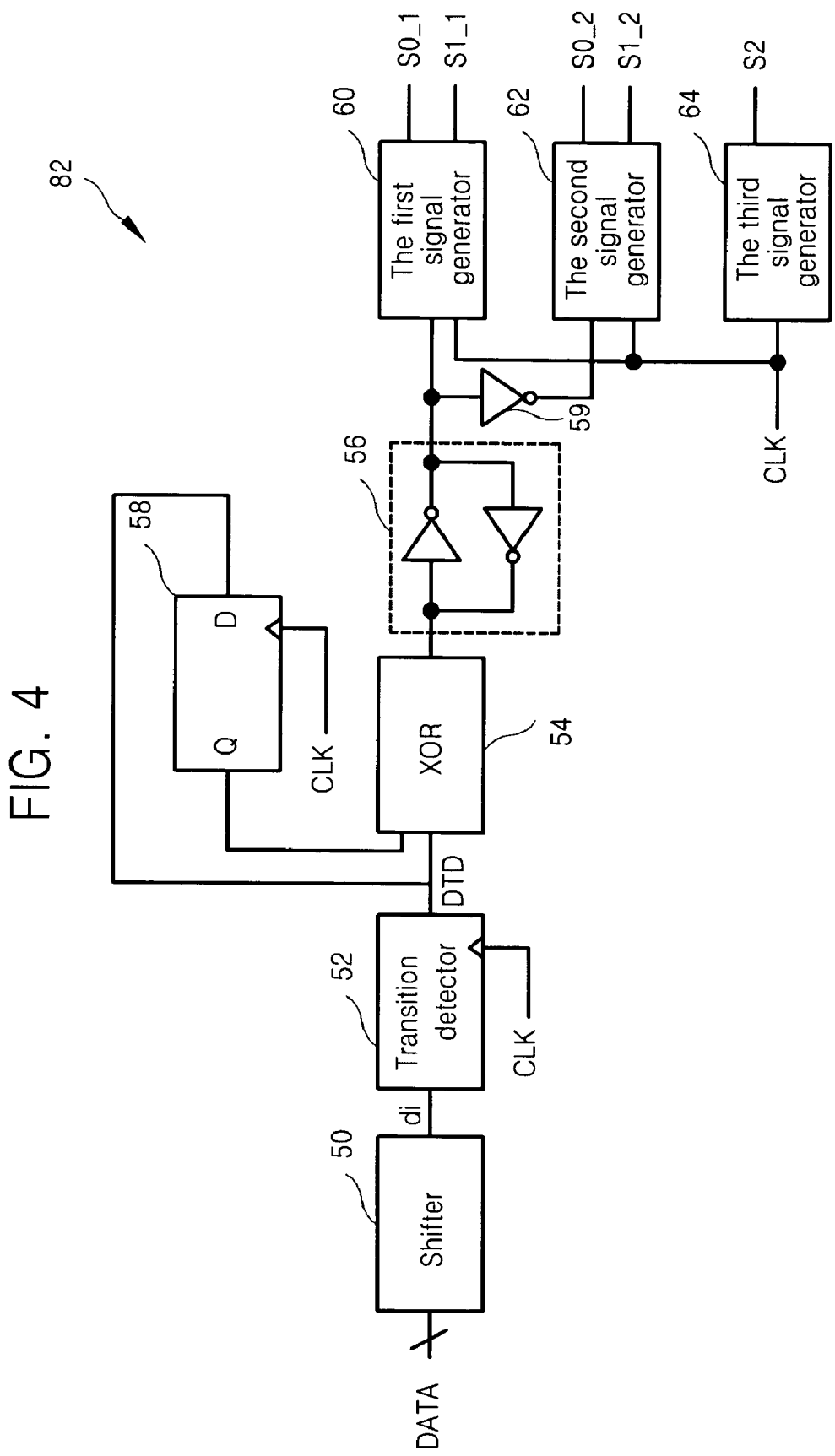
FIG. 4 depicts a schematic of a switching signal generator (according to an example embodiment of the present invention) such as in FIGS. 1A-1B.

FIG. 4 depicts a schematic of a switching signal generator (according to an example embodiment of the present invention) such as in FIGS. 1A-1B.

Switching Signal Generator (again, SSG) includes: a shift register 50 that receives each word of the signal DATA; a transition detector 52 that receives an $i^{th}$ bit di from shift register 50 and the clock signal CLK, and functions at least in part as a 1-bit latch; an Exclusive-OR (XOR) gate 54 that receives transition-detected di (DTD) from transition detector 52 as one of its inputs; a comparison result latch 56 that receives the output (representing a comparison) of XOR 54; a data (or D) latch 58 that receives DTD from transition detector and delays the same to provide di+1 to the other input of XOR 54; a first signal generator 60 that receives the output of latch 56 and the clock signal CLK, and produces switching signals S0_1 and S1_1; a second signal generator 62 that receives an inverted output of latch 56 (via an inverter 59) and the clock signal CLK, and produces switching signals S0_2 and S1_2; and a third signal generator 64 that receives the clock signal CLK and produces switching signal S2.

Shift register 50, transition detector 52, D-latch 58 and XOR 56 can be described as an example of how to implement the swap-decision rule, R2, discussed above. In view of FIGS. 2A-2G, the skilled artisan would understand readily how to implement each of first, second and third generators 60, 62 and 64, respectively.

Figure 5:
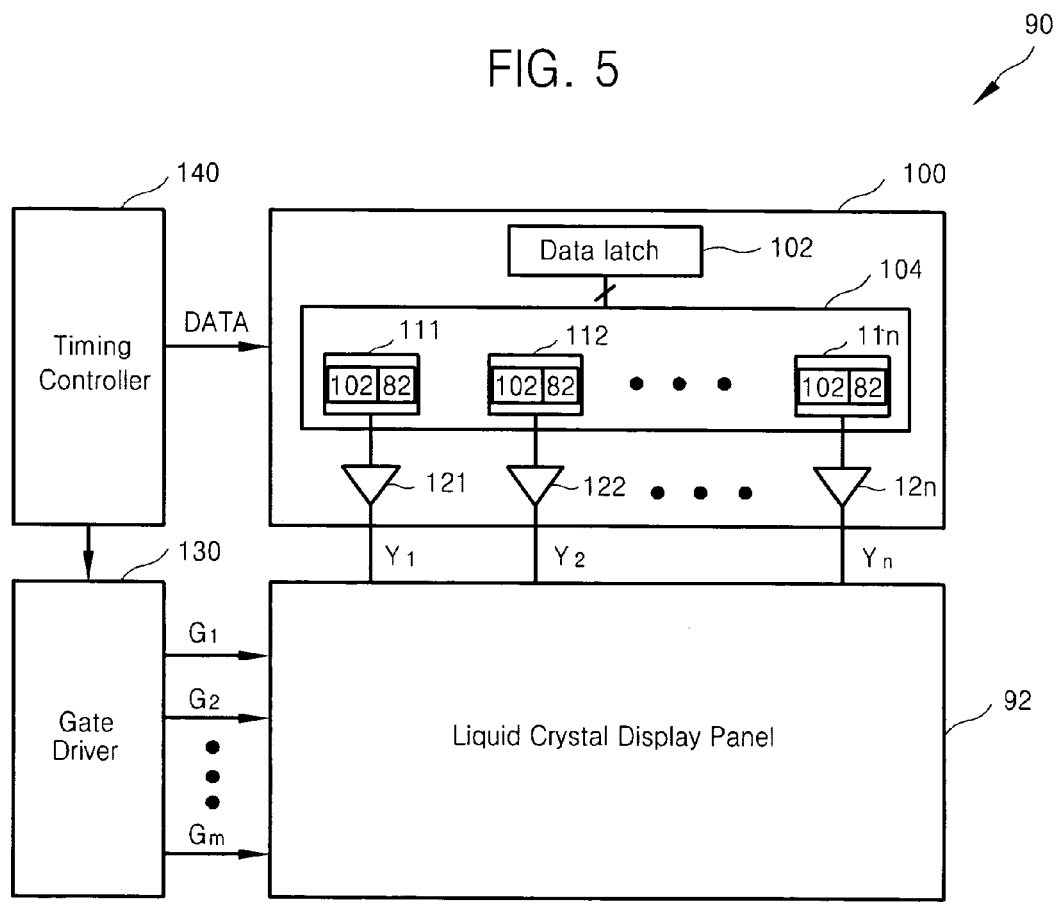
FIG. 5 is a block diagram of a system (according to an example embodiment of the present invention), e.g., a liquid crystal display device, that employs such as in FIGS. 1A-1B.

FIG. 5 is a block diagram of a system(according to an example embodiment of the present invention), e.g., a liquid crystal display device, that employs such as in FIGS. 1A-1B.

Liquid crystal display (LCD) device 90 includes: an LCD panel 92; a source driver 100; a gate driver 120; and a timing controller 140. Source driver 100 includes: a data latch 102 that holds, e.g., a single N-bit word and outputs the same in parallel; a bank 104 of CDACs $11_1$, $11_2 \sim 11_N$ that receives the N-bit word from data latch 102; and a bank of buffer amplifiers $12_1$, $12_2 \sim 12_N$ that are interposed between bank 104 and LCD panel 92. Each CDAC 11i corresponds to CDAC 100 and includes at least VCC circuit 102 and SSG 82.

Figure 6:
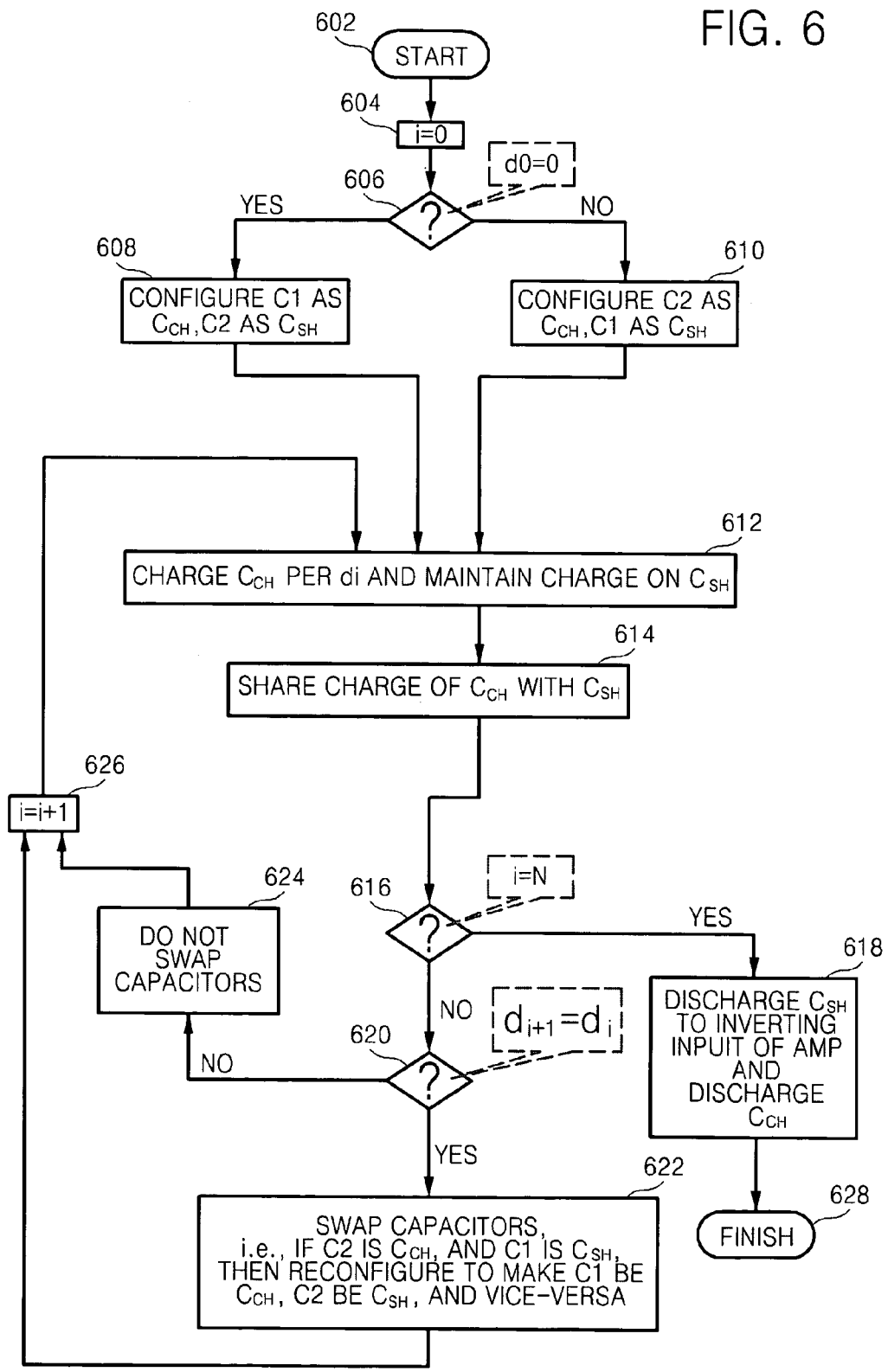
FIG. 6 is a flowchart depicting a method (according to an example embodiment of the present invention) of operating a capacitor-switched CDAC according to bit adjacency.
Figure 7:
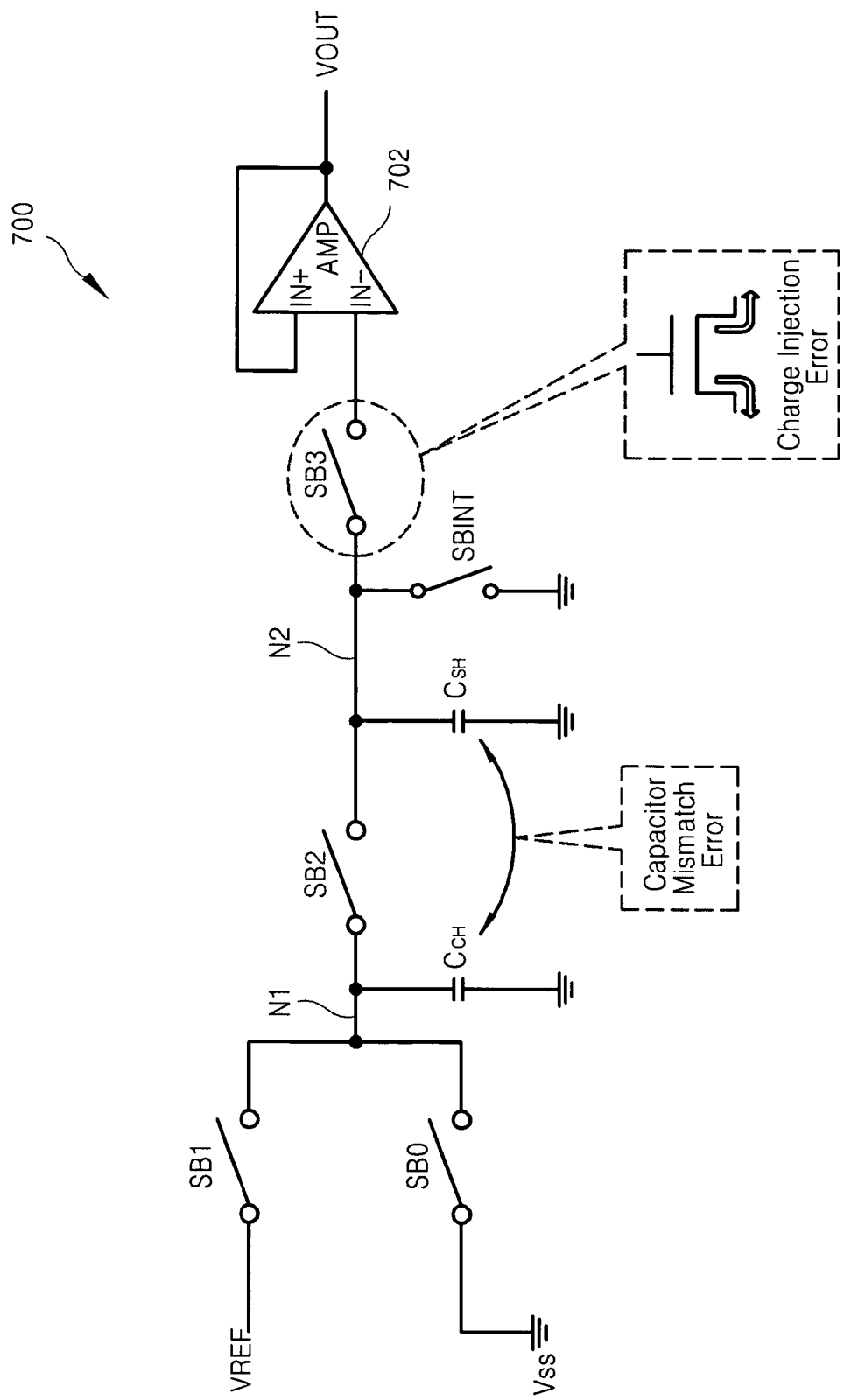
FIG. 7 is a schematic of a serial charge-redistribution cyclic digital-to-analog converter (CDAC) according to the Background Art.

FIG. 6 is a flowchart depicting a method(according to an example embodiment of the present invention) of operating a capacitor-switched CDAC according to bit adjacency.

In FIG. 6, flow begins at block 602 and proceeds to block 604, where a count, i, is initialized, e.g., i=0. Flow proceeds to decision block 606, where it is determined whether the LSB (again, least significant bit), d0, is equal to zero. If so (outcome is Yes), then flow proceeds to block 608, where first capacitor C1 is designated as the charging capacitor $C_{CH}$ for time interval T0, C1=$C_{CH}$(T0), and the second capacitor C2 is designated as the sharing capacitor $C_{SH}$ for time interval T0, C2=$C_{SH}$(T0). If not (outcome is No), then flow proceeds to block 610, where first capacitor C1 is designated as the sharing capacitor $C_{SH}$ for time interval T0, C1=$C_{SH}$(T0), and the second capacitor C2 is designated as the charging capacitor $C_{CH}$ for time interval T0, C2=$C_{CH}$(T0). It should be recognized that blocks 606-610 correspond to Rule (1), discussed above.

From each of blocks 608 and 610, flow proceeds to block 612, where the charging capacitor $C_{CH}$ is charged according to the logical value of di while the charge on the sharing capacitor $C_{SH}$ is maintained. Flow proceeds to block 614, where the charge on the charging capacitor $C_{CH}$ is shared with the sharing capacitor $C_{SH}$. Flow proceeds to decision block 616, where it is determined whether i=N. If so (outcome is Yes), then flow proceeds to block 618, where the charging capacitor $C_{CH}$ is isolated from the sharing capacitor $C_{SH}$, the charge on the sharing capacitor $C_{SH}$ is provided to the inverting input of op-amp 80, and the charging capacitor $C_{CH}$ is discharged. From block 618, flow proceeds to block 628, where the flow ends. If the outcome of decision block 616 is No, then flow proceeds to decision block 620.

At decision block 620, it is determined if consecutive bits are the same, i.e., if di+1=di. If so (outcome is Yes), then flow proceeds to block 622 where the capacitors are swapped. An example of swapping the capacitors is that if C2=Cch and C1=Csh, then the various switch settings are reconfigured so that C2=Csh and C1=Cch, or vice-versa. If the outcome is No, then flow proceeds to block 624 and the capacitors are not swapped. It should be recognized that blocks 620-624 correspond to Rule (2), discussed above.

From each of blocks 622 and 624, flow proceeds to block 626, where i is incremented, i=i+1. From block 626, flow loops back to block 612.

At least one embodiment of the present invention exhibits an improvement of about 13.4% in RMS of the INL error and about 99.6% in RMS of the DNL error using the bit-adjacency swapping-decision Rule (2) and the designation Rule (1) as contrasted with the Background Art cumulative swapping decision Rule, for a circumstance of about 0.2% mismatch between capacitors C1 and C2. In additional, this embodiment exhibits about the same maximal INL error as the Background Art Rule, but has maximal DNL error of only about 1% of the maximal DNL error of the Background Art Rule.

One or more embodiments of the present invention exhibit at least one or more of the following advantages: capacitor mismatch compensation via capacitor-swapping; reduced charge injection and/or clock feedthrough error via unit gain amplifier; improved INL/DNL characteristics; good performance and high conversion accuracy; cost effective, reduced footprint architecture (which can be significant, e.g., in the context of an LCD device); and improved conversion speed.

With some embodiments of the present invention having thus been described, it will be obvious that the same may be varied in many ways. Such variations are not to be regarded as a departure from the spirit and scope of the present invention, and all such modifications are intended to be included within the scope of the present invention.

The invention claimed is:

1. A cyclic digital to analog converter (CDAC) comprising:
   first and second capacitors C1 and C2;
   an arrangement of switches selectively controllable to connect C1 and C2 in one of at least two charging-and-sharing configurations, a first configuration having the first capacitor C1 as a charging capacitor $C_{CH}$ and the second capacitor C2 as a sharing capacitor $C_{SH}$, namely $C_{CH}$=C1 and $C_{SH}$=C2, and a second configuration having $C_{CH}$=C2 and $C_{SH}$=C1; and
   a controller to toggle the arrangement of switches between the first and second configurations based upon adjacent bits of a given input word.

2. The CDAC of claim 1, wherein the controller is further operable to do the following:
   designate an alpha capacitor Cα and a beta capacitor Cβ as the first capacitor C1 and the second capacitor C2, namely Cα=C1 and Cβ=C2, or vice-versa Cα=C2 and Cβ=C1; and
   initialize the arrangement of the switches according to the designation.

3. The CDAC of claim 1, wherein the controller is further operable to do the following:
   toggle, for an $i^{th}$ bit of an N-bit input word, $d_{N-1}d_{N-2} \ldots d_1d_0$, between the first and second configurations according to the following,
   if d(i+1)=d(i), then toggle, and
   if d(i+1)≠d(i), then do not toggle.

4. The CDAC of claim 1, further comprising:
   a unit gain amplifier to amplify a voltage on the second capacitor C2.

5. The CDAC of claim 4, wherein the unit gain amplifier includes:
   another arrangement of switches to selectively configure the second capacitor C2 as a feedback capacitor of the unit gain amplifier.

6. The CDAC of claim 1, wherein the controller toggles the arrangement of switches between the first and second configurations based upon whether the adjacent bits of the given input word are the same or different.

7. The CDAC of claim 6, wherein the controller toggles the arrangement of switches between the first and second configurations if the adjacent bits of the given input word have the same value.

8. The CDAC of claim 6, wherein the controller toggles the arrangement of switches between the first and second configurations if the adjacent bits are the same, but does not toggle the arrangement of switches between the first and second configurations if the adjacent bits of the given input word are different.

9. A cyclic digital to analog converter (CDAC) comprising:
   first and second capacitors C1 and C2,
   an arrangement of switches selectively controllable to connect C1 and C2 in one of at least two configurations, a first configuration having the first capacitor C1 as a charging capacitor $C_{CH}$ and the second capacitor C2 as a sharing capacitor $C_{SH}$, namely ($C_{CH}$=C1, $C_{SH}$=C2), and a second configuration having $C_{CH}$=C2 and $C_{SH}$=C1; and
   a controller to toggle the arrangement of the switches between the first and second configurations based upon adjacent bits of a given input word; wherein
   the controller toggles the arrangement of switches between the first and second configurations by operating upon bits of the given input word in an order that proceeds from less significant bits to more significant bits.

10. A cyclic digital to analog converter (CDAC) for converting an N-bit word, the CDAC comprising:
    first and second capacitors C1 and C2;
    an arrangement of switches selectively controllable to connect C1 and C2 in one of at least two configurations, a first configuration having the first capacitor C1 as a charging capacitor $C_{CH}$ and the second capacitor C2 as a sharing capacitor $C_{SH}$, namely ($C_{CH}$=C1, $C_{SH}$=C2), and a second configuration having $C_{CH}$=C2 and $C_{SH}$=C1; and
    a controller to toggle the arrangement of switches between the first and second configurations based upon adjacent bits of a given input word, wherein
    the controller toggle, for an $i^{th}$ bit of the N-bit word, the arrangement of switches between the first and second configurations without having to examine all N-bits as a prerequisite.

11. A method of using a charging-and-sharing arrangement of first and second capacitors C1 and C2 to facilitate digital to-analog conversion, the method comprising:
    examining adjacent bits of a given input word; and
    selectively connecting the first and second capacitors C1 and C2 in one of two configurations, namely a first configuration in which the first capacitor C1 is a charging capacitor $C_{CH}$ and the second capacitor C2 is a sharing capacitor $C_{SH}$ and a second configuration that is the converse thereof, based upon the examination.

12. The method of claim 11, further comprising:
    designating an alpha capacitor Cα and a beta capacitor Cβ as the first capacitor C1 and the second capacitor C2, namely Cα=C1 and Cβ=C2, or vice-versa Cα=C2 and Cβ=C1; and
    initializing the arrangement of the switches according to the designation.

13. The method of claim 12, where the designating step includes:
    determining if the least significant bit, d0, has the same logical value as a logical reference, LREF; corresponding to a reference value; and
    designating, if so, CαC1 and Cβ=C2, and if not then Cα=C2 and Cβ=C1.

14. The method of claim 11, further comprising:
    toggling, for an $i^{th}$ bit of an N-bit input word, $d_{N-1}d_{N-2} \ldots d_1d_0$, between the first and second configurations according to the following,
    if d(i+1)=d(i), then toggle, and
    if d(i+1)≠d(i), then do not toggle.

15. A method of using a charging-and-sharing arrangement of first and second C1 and C2 to facilitate digital to-analog conversion, the method comprising:
    selectively connecting the first and second capacitors C1 and C2 in one of two configurations, namely a first configuration in which the first capacitor C1 is a charging capacitor $C_{CH}$ and the second capacitor C2 is a sharing capacitor $C_{SH}$ and a second configuration that is the converse thereof, based upon adjacent bits of a given input word, bits of the given input word being operated on in an order that proceeds from less significant bits to more significant bits.

16. A method of using a charging-and-sharing arrangement of first and second C1 and C2 to facilitate digital to-analog conversion, the method comprising:
   providing first and second capacitors C1 and C2;
   selectively connecting C1 and C2 in one of at least two configurations, a first configuration having the first capacitor C1 as a charging capacitor $C_{CH}$ and the second capacitor C2 as a sharing capacitor $C_{SH}$, namely ($C_{CH}$=C1, $C_{SH}$=C2), and a second configuration having $C_{CH}$=C2 and $C_{SH}$=C1; and
   toggling the arrangement of switches between the first and second configurations based upon adjacent bits of a given input word, wherein
      the toggling toggles, for an $i^{th}$ bit of the N-bit word, between the first and second configurations without having to examine all N-bits as a prerequisite.

17. A display device comprising:
   a display panel; and
   gate and source drivers to drive the display panel;
   the source driver including a plurality of cyclic digital to analog converters (CDACs), each CDAC including at least the following,
      a plurality of first and second capacitors C1 and C2;
      an arrangement of switches selectively controllable to connect C1 and C2 in one of at least two configurations, a first configuration having the first capacitor C1 as a charging capacitor $C_{CH}$ and the second capacitor C2 as a sharing capacitor $C_{SH}$, namely ($C_{CH}$=C1, $C_{SH}$=C2), and a second configuration having $C_{CH}$=C2 and $C_{SH}$=C1; and
      a controller to toggle the arrangement of switches between the first and second configurations based upon adjacent bits of a given input word.

18. The display device of claim 17, wherein the controller is further operable to do the following:
   designate an alpha capacitor $C\alpha$ and a beta capacitor $C\beta$ as the first capacitor C1 and the second capacitor C2, namely $C\alpha$=C1 and $C\beta$=C2, or vice-versa $C\alpha$=C2 and $C\beta$=C1; and
   initialize the arrangement of the switches according to the designation.

19. The display device of claim 17, wherein the controller is further operable to do the following:
   toggle, for an $i^{th}$ bit of an N-bit input word, $d_{N-1}d_{N-2} \ldots d_1 d_0$, between the first and second configurations according to the following,
      if d(i+1)=d(i), then toggle, and
      if d(i+1)≠d(i), then do not toggle.

20. The display device of claim 17, wherein each CDAC further includes:
   a unit gain amplifier to amplify a voltage on the second capacitor C2.

21. The display device of claim 20, wherein the unit gain amplifier includes:
   another arrangement of switches to selectively configure the second capacitor C2 as a feedback capacitor of the unit gain amplifier.

* * * * *